(12) United States Patent
Hsu

(10) Patent No.: US 8,289,795 B1
(45) Date of Patent: Oct. 16, 2012

(54) SEMICONDUCTOR MEMORY DEVICE AND METHOD OF TESTING THE SAME

(75) Inventor: Jen-Shou Hsu, Hsinchu (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 0 days.

(21) Appl. No.: 13/270,196

(22) Filed: Oct. 10, 2011

(51) Int. Cl.
*G11C 7/00* (2006.01)

(52) U.S. Cl. ............... 365/203; 365/201; 365/230.06; 365/233.1

(58) Field of Classification Search ............ 365/203, 365/201, 230.06, 233.1
See application file for complete search history.

(56) References Cited

U.S. PATENT DOCUMENTS

| | | | |
|---|---|---|---|
| 5,373,509 A | 12/1994 | Katsura | |
| 6,003,149 A | 12/1999 | Nevill et al. | |
| 6,141,276 A * | 10/2000 | Mullarkey et al. | ............ 365/203 |
| 7,170,797 B2 | 1/2007 | Haetty | |
| 2005/0024117 A1 | 2/2005 | Kubo et al. | |

* cited by examiner

*Primary Examiner* — Jason Lappas
(74) *Attorney, Agent, or Firm* — Jianq Chyun IP Office

(57) ABSTRACT

A semiconductor memory device and a method of testing the same are provided. In the method, the semiconductor memory device enters a test mode after receiving a mode selection signal. After the semiconductor memory device enters the test mode, a first word line is activated. Test data are then sequentially written into a plurality of memory cells coupled to the first word line. The first word line is deactivated, and data between each pair of bit lines are latched. A second word line is activated. After the second word line is activated, the data latched between each pair of bit lines are directly written into the memory cells coupled to the second word line.

12 Claims, 8 Drawing Sheets

SEMICONDUCTOR MEMORY DEVICE AND METHOD OF TESTING THE SAME

BACKGROUND OF THE INVENTION

1. Field of the Invention

The invention relates to a semiconductor memory device and a method of testing the same.

2. Description of Related Art

A typical semiconductor memory device is constituted by a plurality of memory cells. After the semiconductor memory device is completely formed and before the device is packaged, the device needs to be inspected in order to find defective memory cells. In a method of testing the typical memory device, certain data patterns "0" and "1" are written into each of the memory cells, and data stored in the memory cells are read, so as to detect any unexpected value.

FIG. 1 is a schematic view illustrating the structure of a conventional semiconductor memory device 10. With reference to FIG. 1, the semiconductor memory device 10 includes a plurality of pairs of bit lines, a plurality of word lines WL[0], WL[1], and WL[2], and a plurality of memory cells MC placed at crossing positions of the bit lines and the word lines. Each pair of the bit lines is constructed of one bit line BL and one complementary bit line /BL. The semiconductor memory device 10 further includes a command/address controller 11, a sensing signal generating circuit 12, a row decoder 14, a column decoder 16, a sensing amplifier unit 18, and a pre-charging circuit unit 19. The sensing amplifier unit 18 and the pre-charging circuit unit 19 are coupled to the pairs of bit lines.

FIG. 2 is a timing diagram illustrating that the semiconductor memory device 10 is operated in a test mode. With reference to FIG. 1 and FIG. 2, after the command/address controller 11 in the semiconductor memory device 10 receives a first activate command CMD1 that synchronizes with an external clock signal XCLK, the row decoder 14 activates a first word line WL[0], so as to turn on the memory cells into which the data are to be written. After the first word line WL[0] is activated, the sensing signal generating circuit 12 outputs a sensing enabling signal SAE at the logic high level, so as to activate the sensing amplifier unit 18 and deactivate the pre-charging circuit unit 19. Next, the command/address controller 11 receives N write commands CMD2 to generate N column selection signals and transfer the N column selection signals to the column decoder 16. The column decoder 16 sequentially writes the test data into the memory cells MC coupled to the first word line WL[0] based on the column selection signals.

After the test data are written into the memory cells MC, the command/address controller 11 receives a pre-charge command CMD3 to deactivate the first word line WL[0]. After the first word line WL[0] is deactivated, the sensing signal generating circuit 12 outputs the sensing enabling signal SAE at the logic low level, so as to deactivate the sensing amplifier unit 18 and activate the pre-charging circuit unit 19. Hence, a pre-charging voltage lower than a power voltage is applied between each pair of bit lines.

In order to write the test data into the memory cells MC coupled to other word lines, the above-mentioned steps should be repeated in the semiconductor memory device 10, e.g., steps of activating a second word line WL[1], generating N column selection signals to sequentially write the test data into a selected pair of bit lines, deactivating the second word line WL[1], and pre-charging the pair of bit lines. As the number of the pairs of bit lines and the number of the word lines increases, significant time is required for writing the test data into all of the memory cells MC in the semiconductor memory device 10.

Therefore, a semiconductor memory device and a method of testing the same are necessary in order to effectively reduce the time of writing the test data into the semiconductor memory device.

SUMMARY OF THE INVENTION

The invention is directed to a semiconductor memory device and a method of testing the same. In order to detect defective memory cells in a semiconductor memory device, the semiconductor memory device enters a test mode, and test data are then written into the semiconductor memory device. The semiconductor memory device then enters a normal mode to read the written data.

In an embodiment of the invention, the semiconductor memory device includes a plurality of memory units and a command decoder. Each of the memory units includes a memory array and a sensing signal generating circuit. The memory array includes a plurality of pairs of bit lines, a plurality of word lines, a plurality of memory cells placed at crossing positions of the bit lines and the word lines, and a plurality of sensing amplifiers. Each of the sensing amplifiers is coupled to one of the pairs of bit lines, so as to latch data of the one of the pairs of bit lines according to a sensing enabling signal. The sensing signal generating circuit is capable of generating the sensing enabling signal to activate the sensing amplifiers and is capable of stopping generating the sensing enabling signal to deactivate the sensing amplifiers. The command decoder is capable of generating a first row enabling signal after receiving a first activate command, so as to activate a first word line of the word lines in a first memory unit of the memory units. After receiving a set of write commands, the command decoder generates a set of column enabling signals and sequentially writes test data into the memory cells coupled to the first word line according to the set of column enabling signals. After receiving a first pre-charge command, the command decoder stops generating the first row enabling signal, so as to deactivate the first word line. After receiving a second activate command, the command decoder generates a second row enabling signal, so as to activate a second word line of the word lines. After receiving a second pre-charge command, the command decoder stops generating the second row enabling signal, so as to deactivate the second word line. The semiconductor memory device is selectively operated in a normal mode or a test mode. When the semiconductor memory device is in the test mode, the sensing signal generating circuit generates the sensing enabling signal after the command decoder receives the first activate command, and the sensing signal generating circuit maintains a voltage value of the sensing enabling signal after the command decoder receives the first pre-charge command, such that data latched by the sensing amplifiers are directly written into the memory cells which are coupled to the second word line after the second word line is activated.

In an embodiment of the invention, a method of testing a semiconductor memory device is further provided. The semiconductor memory device includes a plurality of memory units. Each of the memory units includes a plurality of pairs of bit lines, a plurality of word lines, a plurality of memory cells placed at crossing positions of the bit lines and the word lines, a plurality of sensing amplifiers, and a plurality of pre-charging circuits. Each of the sensing amplifiers is coupled to one of the pairs of the bit lines, and each of the pre-charging circuits is coupled to one of the pairs of the bit lines. According to an embodiment of the invention, the method includes following steps: determining whether the semiconductor memory device is operated in a normal mode or a test mode according to a mode selection signal; activating a first word line of the word lines in a first memory unit of the memory units according to a first activate command, a first row enabling signal, and a first row address when the semiconductor memory device is operated in the test mode; activating the sensing amplifiers of the first memory unit after activating the first word line; generating a set of column enabling signals according to a set of write commands after activating the sensing amplifiers; sequentially writing test data into the memory cells coupled to the first word line according to the set of column enabling signals; deactivating the first word line according to a first pre-charge command after writing the test data into the memory cells; continuously activating the sensing amplifiers and deactivating the pre-charging circuits of the first memory unit after deactivating the first word line; providing a second row address according to a second activating command to enable a second word line of the word lines in the first memory unit; directly writing the data latched by the sensing amplifiers into the memory cells coupled to the second word line.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF EMBODIMENTS

Figure 1:
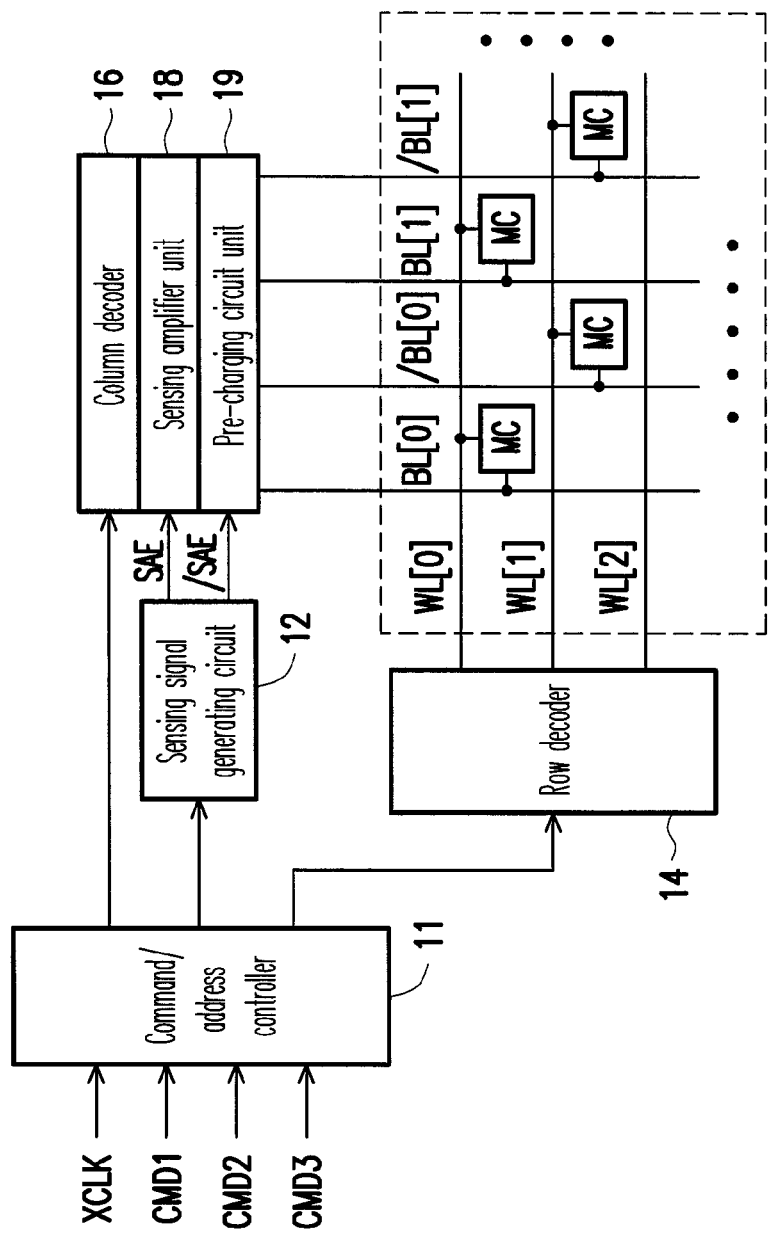
FIG. 1 is a schematic view illustrating the structure of a conventional semiconductor memory device.
Figure 2:
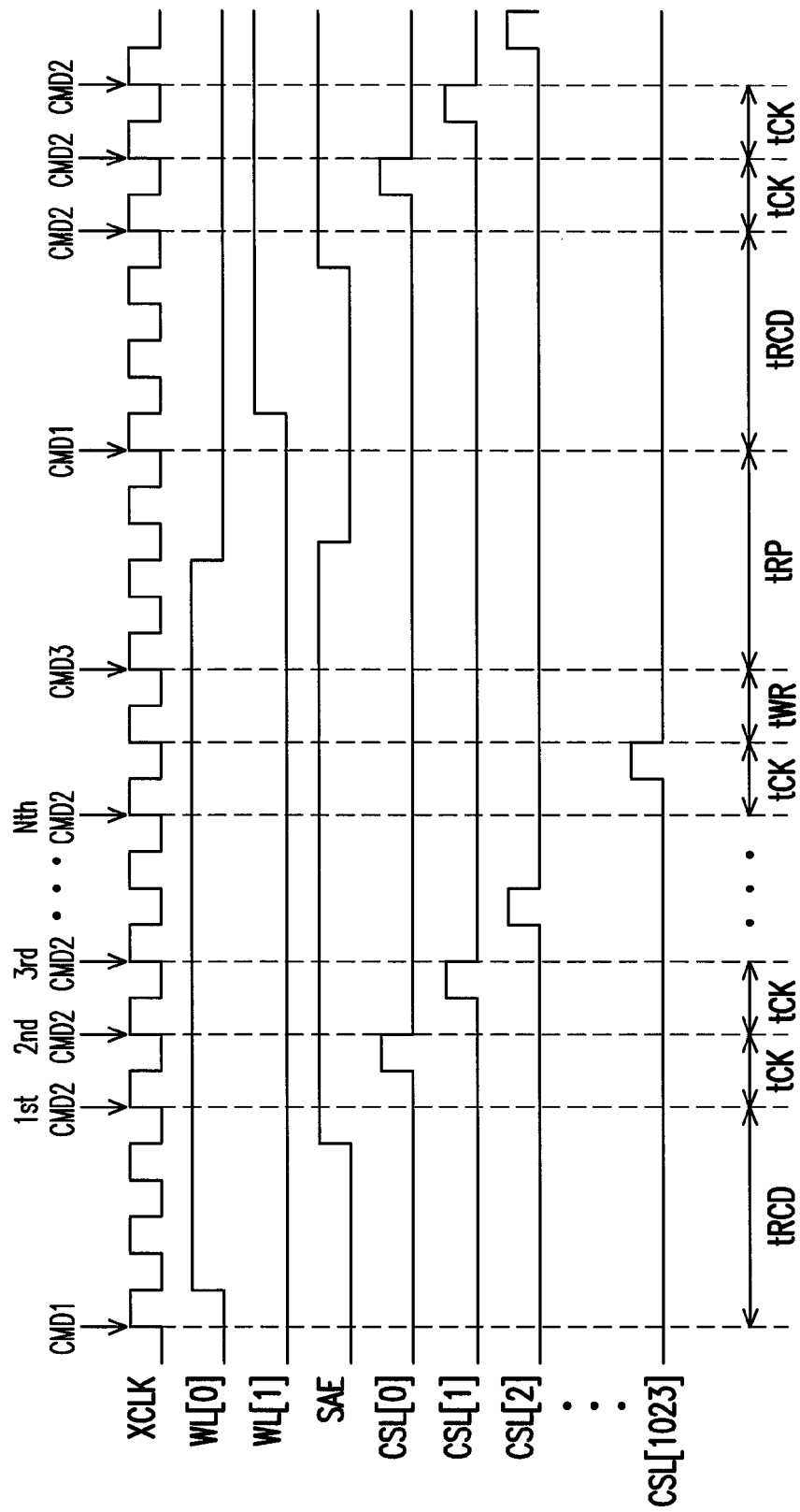
FIG. 2 is a timing diagram illustrating that the semiconductor memory device is operated in a test mode.
Figure 3:
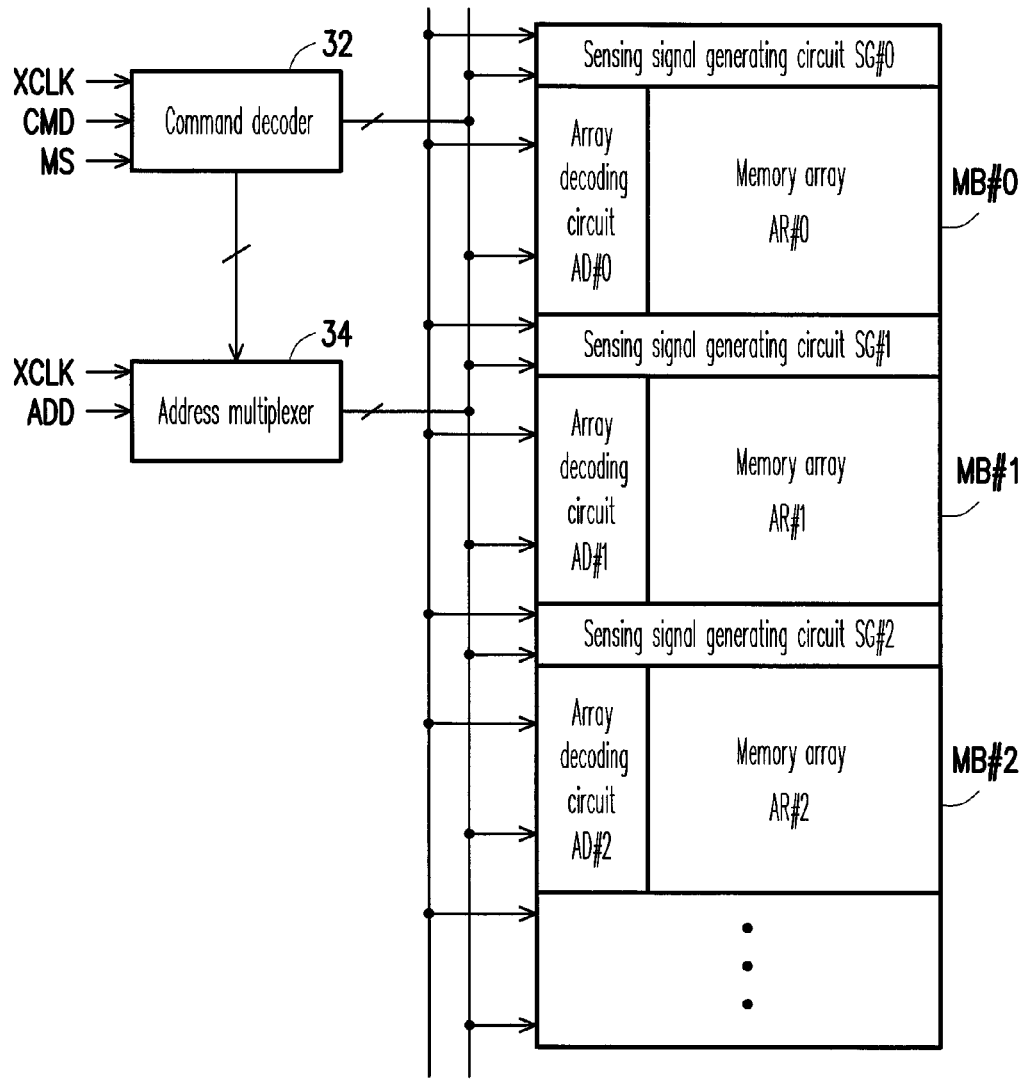
FIG. 3 is a schematic view illustrating the structure of a semiconductor memory device according to an embodiment of the invention.

FIG. 3 is a schematic view illustrating the structure of a semiconductor memory device 30 according to an embodiment of the invention. With reference to FIG. 3, the semiconductor memory device 30 includes a plurality of memory units MB#0, MB#1, and MB#2, and each of the memory units MB#0, MB#1, and MB#2 includes a memory array. A plurality of array decoding circuits AD#0, AD#1, and AD#2 individually activate and deactivate a plurality of memory arrays AR#0, AR#1, and AR#2, and a plurality of sensing signal generating circuits SG#0, SG#1, and SG#2 individually generate sensing enabling signals and transfer the sensing enabling signals to the memory arrays AR#0, AR#1, and AR#2.

As indicated in FIG. 3, the semiconductor memory device 30 further includes a command decoder 32. The command decoder 32 receives an external command signal CMD that synchronizes with a clock signal XCLK. The external command signal CMD can be an individual control signal, e.g., a chip selection signal /CS, a row address strobe signal /RAS, a column address strobe signal /CAS, or a write enabling signal /WE. The command decoder 32 decodes the command signal CMD, so as to generate the control signal for reading data from and writing data into each memory cell in the memory arrays AR#0, AR#1, and AR#2. The semiconductor memory device 30 further includes an address multiplexer 34. The address multiplexer 34 receives an external address signal ADD that synchronizes with the clock signal XCLK, so as to generate a row address AX or a column address AY.

Figure 4:
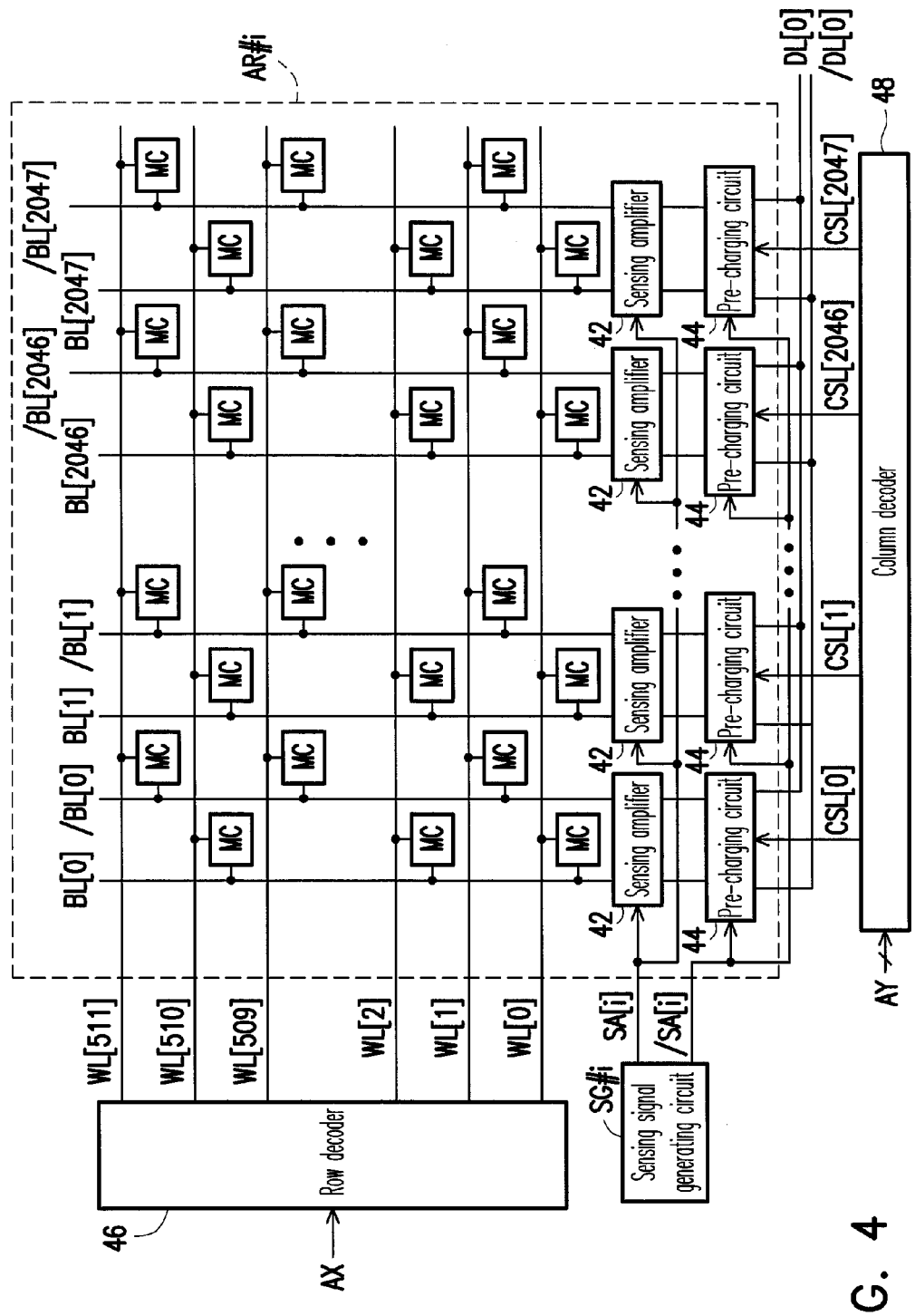
FIG. 4 is a schematic circuit diagram illustrating memory units according to an embodiment of the invention.

FIG. 4 is a schematic circuit diagram illustrating memory units MBi (i=0, 1, or 2) according to an embodiment of the invention. With reference to FIG. 4, each of the memory units MBi includes a memory array ARi. The memory array ARi includes a plurality of pairs of bit lines, and each pair of bit lines is constituted of one bit line BL and one complementary bit line /BL. The memory array ARi further includes a plurality of word lines WL. In this embodiment, the memory array ARi includes 2048 pairs of bit lines and 512 word lines. A memory cell MC is placed at a crossing position of a certain bit line BL and a certain word line WL, so as to store data. In FIG. 4, the array decoding circuit ADi shown in FIG. 3 is constituted of a row decoder 46 and a column decoder 48. The row decoder 46 generates a word line selection signal, so as to activate a specific word line; the column decoder 48 generates a column selection signal, so as to write data into or read data from the memory cells MC that are coupled to a specific bit line.

As indicated in FIG. 4, the memory array ARi further includes a plurality of sensing amplifiers 42 and a plurality of pre-charging circuits 44. Each of the sensing amplifiers 42 and each of the pre-charging circuits 44 are coupled to one pair of bit lines. A sensing signal generating circuit SGi generates a sensing enabling signal SA[i] to activate the sensing amplifiers 42 and deactivate the pre-charging circuits 44. Besides, the sensing signal generating circuit SGi stops generating the sensing enabling signal SA[i] to deactivate the sensing amplifiers 42 and activate the pre-charging circuits 44. When the sensing amplifiers 42 are activated, the data stored in the corresponding pairs of bit lines are latched. When the pre-charging circuits 44 are activated, a pre-charge voltage lower than a power voltage is applied to the corresponding pair of bit lines.

Figure 5:
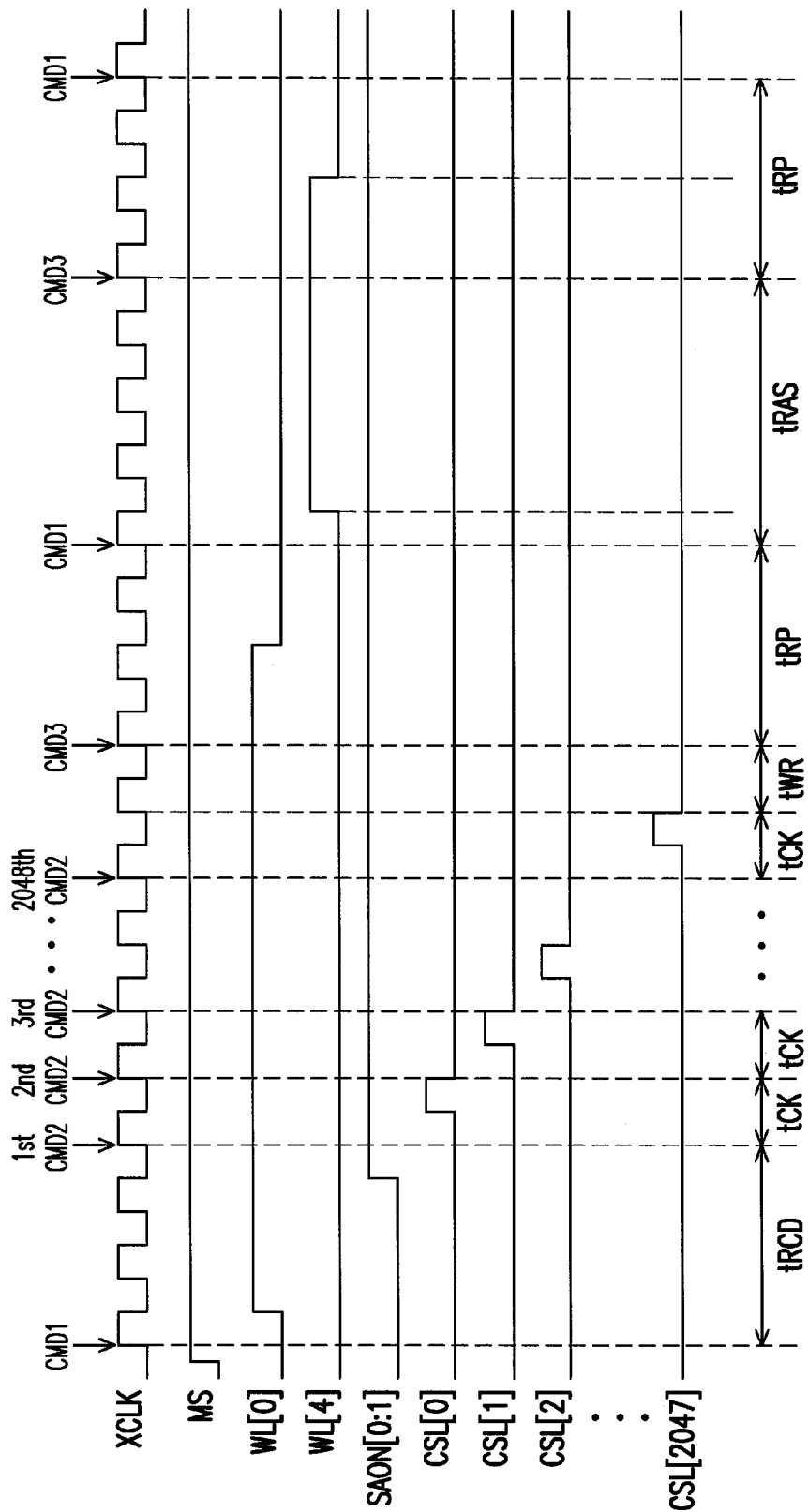
FIG. 5 is a timing diagram illustrating that the semiconductor memory device is operated in a test mode according to an embodiment of the invention.

After the semiconductor memory device 30 is completely formed, the semiconductor memory device 30 enters a test mode, and test data are written into the memory cells MC in order to detect defective memory cells in the semiconductor memory device 30. After the test data are written into the memory cells MC, the semiconductor memory device 30 enters a normal mode to read the data stored in the memory cells MC, so as to detect any unexpected value. FIG. 5 is a timing diagram illustrating that the semiconductor memory device 30 is operated in the test mode according to an embodiment of the invention. The timing diagram of FIG. 5 is described with reference to the circuit diagrams of FIG. 3 and FIG. 4. In FIG. 3, the semiconductor memory device 30 enters the test mode after the command decoder 32 receives a mode selection signal MS at a logic high level. After the semiconductor memory device 30 enters the test mode, the command decoder 32 receives a first activate command CMD1 and then generates a first row enabling signal and transfers the same to the address multiplexer 34 and the row decoder 46. The address multiplexer 34 receives an address ADD, and after receiving the first row enabling signal, the address multiplexer 34 generates a row address AX and transfers the same to the row decoder 46 in the memory unit MB#0. The row decoder 46 activates the word line WL[0] in the memory unit MB#0 based on the row address AX and the first row enabling signal. After the word line WL[0] is activated, the sensing signal generating circuit SG#0 in the first memory unit MB#0 outputs the sensing enabling signal SA at the logic high level, so as to activate the sensing amplifiers 42 and deactivate the pre-charging circuits 44. Hence, the sensing amplifiers 42 detect the minor voltage differences between the pairs of bit lines BL and /BL, and amplify one of them to the ground voltage VSS and the other to the core voltage VCORE.

The command decoder 32 then receives a set of write commands $1^{st}$ CMD2, $2^{nd}$ CMD2, ..., and $2048^{th}$ CMD2 to generate a set of column enabling signals and transfer the same to the address multiplexer 34 and the column decoder 48. The address multiplexer 34 receives the address ADD, and after receiving the set of column enabling signals, the address multiplexer 34 generates a set of column addresses AY and transfers the same to the column decoder 48 in the memory unit MB#0. Next, the column decoder 48 generates a set of column selection signals CSL[0:2047] based on the set of column addresses AY. According to the set of column selection signals CSL[0:2047], the column decoder 48, by means of a data input/output buffer (not shown), sequentially writes the test data into the 2048 memory cells MC via the data lines DL[0] and /DL[0]. Here, the 2048 memory cells MC are coupled to the word line WL[0].

After the test data are written into the memory cells MC, the command decoder 32 receives a first pre-charge command CMD3, so as to stop generating the first row enabling signal. Hence, the row decoder 46 deactivates the word line WL[0] in the memory unit MB#0. When the word line WL[0] is deactivated, the sensing signal generating circuit SG#0 maintains the logic level of the sensing enabling signal SA. Hence, the sensing amplifiers 42 are continuously enabled, and the pre-charging circuits 44 are continuously disabled. In other words, the data between the pairs of bit lines in the memory unit MB#0 are latched.

Next, the command decoder 32 receives a second activate command CMD1 and then generates a second row enabling signal, so as to activate a second word line in the memory unit MB#0. In this embodiment, the second word line is the word line WL[4]. When the word line WL[4] is activated, the memory cells MC coupled to the word line WL[4] are turned on. Hence, the data latched by the sensing amplifiers 42 can be directly written into the 2048 memory cells MC coupled to the word line WL[4], and it is not necessary for the column decoder 48 to sequentially output the column selection signals CSL[0:2047] in order to select a specific pair of bit lines for writing the data. Thereby, the time of writing the test data into the memory cells can be significantly reduced.

For instance, in this embodiment, each of the memory arrays ARi includes 2048 pairs of bit lines and 512 word lines. In the semiconductor memory device 30, it is assumed that a minimum time interval of tRCD is 15 ns, a clock cycle tCK is 15 ns, a minimum time interval of tWR is 15 ns, a minimum time interval of tRAS is 45 ns, and a minimum time interval of tRP is 15 ns. If the test data are written into the memory cells coupled to a specific word line in the memory array in the conventional manner, the minimum time of writing the data is:

$$tRCD+2048 \times tCK+tWR+tRP=30.765 \text{ μs}.$$

The memory array ARi has 512 word lines. Hence, if the test data are to be written into all of the memory cells in the memory array ARi, at least 512×30.765 μs is required. As the number of the memory arrays in the semiconductor memory device 30 increases, significant time is required for writing the test data into the memory cells in all of the memory arrays in the memory device 30.

By contrast, according to the memory device and the testing method of the memory device described in the embodiments of the invention, the minimum time of writing the test data into the memory cells coupled to the first word line is 15.405 μs. When the test data are written into the memory cells coupled to other word lines, each of the bit lines merely requires tRAS+tRP=60 ns for the data writing operation. As a result, the time of writing the data into all of the memory cells in the memory device 30 can be significantly reduced. If the driving capacity of the sensing amplifiers 42 and the data input/output buffer is sufficient, the command decoder 32 can simultaneously generate a plurality of row enabling signals after receiving the second activate command CMD1, so as to enable a plurality of word lines. Therefore, the data latched by the sensing amplifiers 42 can be directly written into the memory cells coupled to the word lines, so as to further reduce the time of writing the data into the memory cells.

According to an embodiment of the invention, the way to generate the row address AX is determined based on the arrangement of the word lines in the semiconductor memory device 30. In consideration of the layout, the yield, and the speed, the scrambling technology is often applied in the semiconductor memory device 30 to generate the non-sequential address. For instance, the arrangement of the word lines is cyclic in most cases. Therefore, when the semiconductor memory device 30 enters the test mode, different test data need to be written into the memory cells coupled to the word lines WL[0], WL[1], WL[2], and WL[3] due to the relative positions of the word lines WL[0], WL[1], WL[2], and WL[3]. However, it is likely to write the same test data into the memory cells coupled to the word lines WL[0], WL[4], WL[8], etc. According to an embodiment of the invention, when a test data is written into the memory cells, the word line WL[0] is activated first. After the test data is sequentially written into the memory cells coupled to the word line WL[0], the word line WL[0] is deactivated. At this time, the data are still latched of the corresponding pair of bit lines. The word lines WL[4], WL[8], WL[12], ... are sequentially or simultaneously enabled, and thus the data latched of the corresponding pair of bit lines are directly written into the memory cells coupled to the activated word lines. The word lines WL[4], WL[8], WL[12], ... are then sequentially or simultaneously deactivated.

After the different test data is sequentially written into the memory cells coupled to the word line WL[1], the word line WL[1] is deactivated. At this time, the data of the pair of bit lines corresponding to the word line WL[1] are still latched. According to the scrambling technology, the word lines WL[5], WL[9], WL[13], ... are then sequentially or simultaneously activated, and thus the data latched of the corresponding pair of bit lines are directly written into the memory cells coupled to the activated word lines. The word lines WL[5], WL[9], WL[13], ... are then sequentially or simultaneously deactivated. The above-mentioned steps are continuously performed until the test data are written into all of the memory cells in the semiconductor memory device 30.

After the test data are written into all the memory cells in the semiconductor memory device 30, the command decoder 32 receives a second pre-charge command CMD3, so as to deactivate the activated word lines in the memory units MB#0, MB#1, and MB#2. The memory device 30 then enters a normal mode to read the data stored in the memory cells in the memory units MB#0, MB#1, and MB#2, and thereby the memory device 30 determines whether the stored data are the same as the test data. With reference to FIG. 3, the semiconductor memory device 30 enters the normal mode after the command decoder 32 receives a mode selection signal MS at a logic low level. After that, the sensing signal generating circuits SG#0, SG#1, and SG#2 of the memory units MB#0, MB#1, and MB#2 in the semiconductor memory device 30 stop generating the sensing enabling signals SA, so as to deactivate the corresponding sensing amplifiers 42 in the memory units MB#0, MB#1, and MB#2. Meanwhile, the corresponding pre-charging circuits 44 in the memory units MB#0, MB#1, and MB#2 are activated based on the inverse sensing enabling signals /SA. Therefore, a pre-charge voltage lower than the core voltage Vcore is applied to each pair of bit lines in the memory units MB#0, MB#1, and MB#2, and the pre-charge voltage is ½ Vcore, for instance. After the pre-charge voltage is applied to each pair of bit lines in the memory units MB#0, MB#1, and MB#2, the memory device 30 can subsequently read the data stored in the memory cells.

Figure 6:
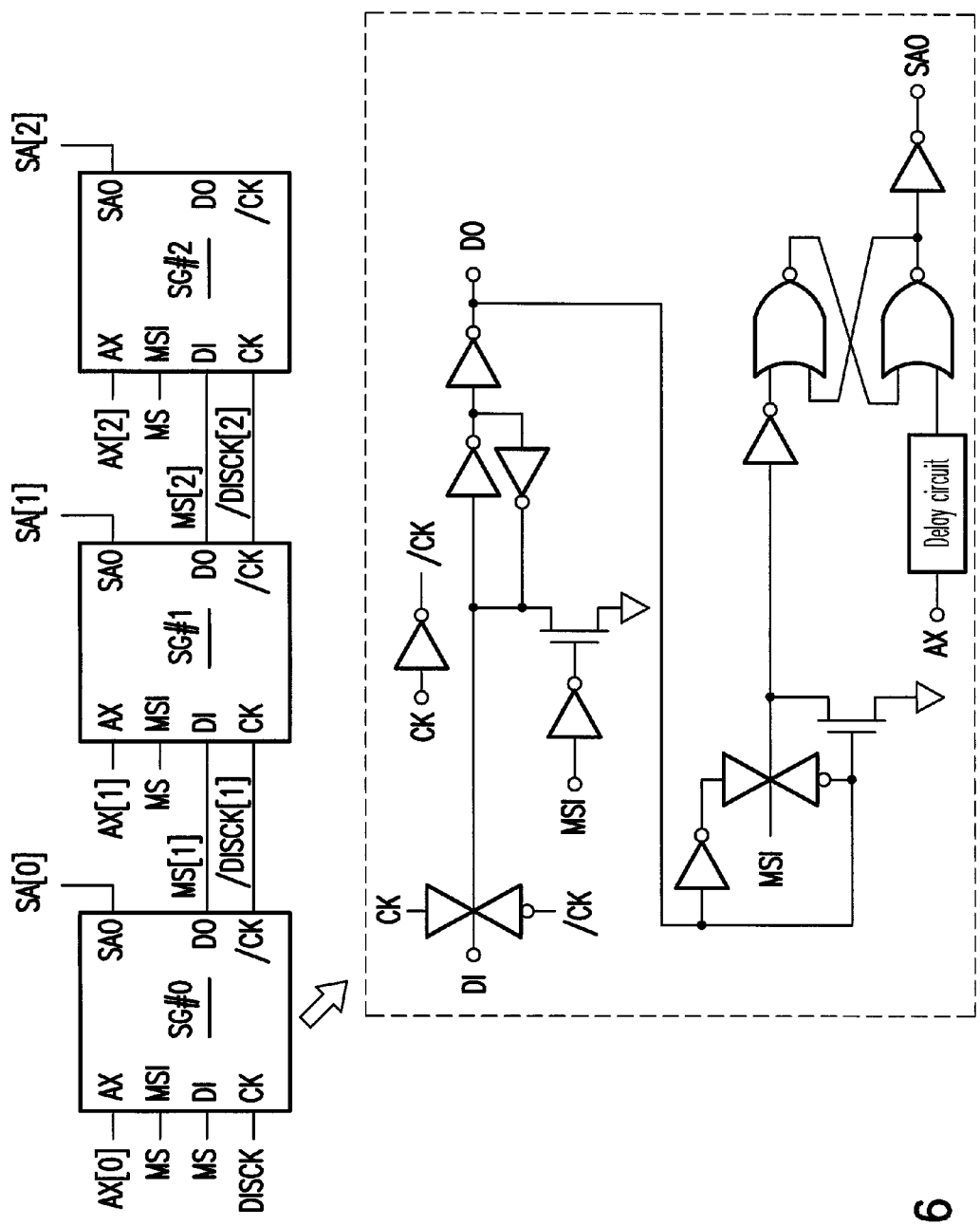
FIG. 6 is a schematic view illustrating sensing signal generating circuits according to an embodiment of the invention.
Figure 7:
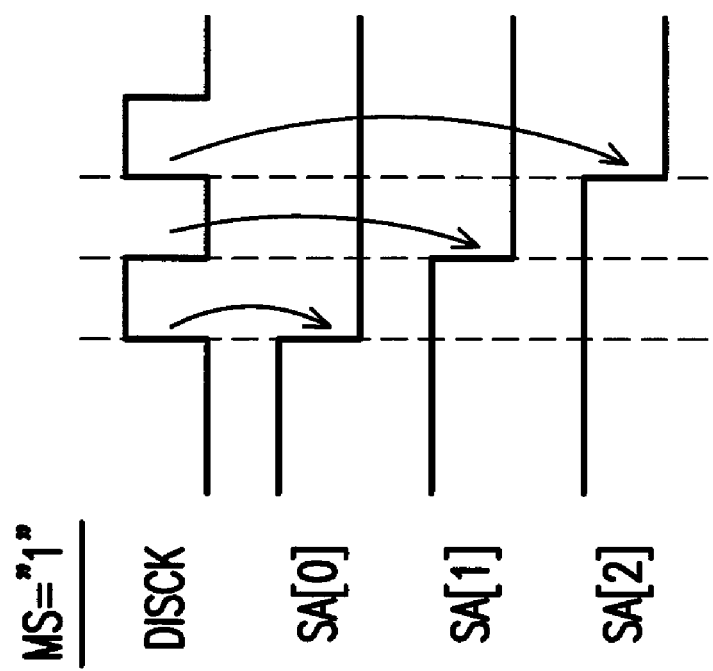
FIG. 7 is a timing diagram illustrating that the sensing signal generating circuits are operated in the test mode.

According to another embodiment of the invention, when all of the word lines in the memory units MB#0, MB#1, and MB#2 are deactivated, the memory device 30 stays in the test mode, and the sensing amplifiers 42 in the memory units MB#0, MB#1, and MB#2 are sequentially deactivated based on a certain order. Since only the sensing amplifiers 42 in one specific memory unit are deactivate each time, the noise interference caused by disabling the sensing amplifiers 42 can be effectively reduced. FIG. 6 is a schematic view illustrating sensing signal generating circuits SG#0, SG#1, and SG#2 according to an embodiment of the invention. FIG. 7 is a timing diagram illustrating that the sensing signal generating circuits SG#0, SG#1, and SG#2 are operated in the test mode. The detailed operation is described below with reference to FIG. 6 and FIG. 7. When the mode selection signal MS is at the logic high level, the memory device 30 is operated in the test mode. After the test data are written into all of the memory cells MC in the memory units MB#0, MB#1, and MB#2 in the semiconductor memory device 30, the output signals SA[0], SA[1], and SA[2] of the sensing signal generating circuits SG#0, SG#1, and SG#2 in the memory units MB#0, MB#1, and MB#2 stay at the high logic level. When the sensing signal generating circuit SG#0 receives a first rising edge of a pulse signal DISCK, the sensing signal generating circuit SG#0 outputs the signal SA[0] at the logic low level to the sensing amplifiers 42 in the memory unit MB#0. Therefore, the sensing amplifiers 42 in the memory unit MB#0 are deactivated, and the pre-charging circuits 44 in the memory unit MB#0 are activated based on the inverse sensing enabling signal /SA[0].

At a first falling edge of the pulse signal DISCK, the sensing signal generating circuit SG#1 outputs the signal SA[1] at the logic low level to the sensing amplifiers 42 in the memory unit MB#1. Therefore, the sensing amplifiers 42 in the memory unit MB#1 are deactivated, and the pre-charging circuits 44 in the memory unit MB#1 are activated based on the inverse sensing enabling signal /SA[1]. At a second rising edge of the pulse signal DISCK, the sensing signal generating circuit SG#2 outputs the signal SA[2] at the logic low level to the sensing amplifiers 42 in the memory unit MB#2. Therefore, the sensing amplifiers 42 in the memory unit MB#2 are deactivated, and the pre-charging circuits 44 in the memory unit MB#2 are activated based on the inverse sensing enabling signal /SA[2]. Thereby, the sensing amplifiers 42 in the memory units MB#0, MB#1, and MB#2 are sequentially deactivated, and the pre-charging circuits 44 in the memory units MB#0, MB#1, and MB#2 are sequentially activated. The sensing amplifiers 42 and the pre-charging circuits 44 in different memory units are not simultaneously enabled, and thus the noise interference in the bit data stored in the memory cells can be significantly reduced.

Figure 8:
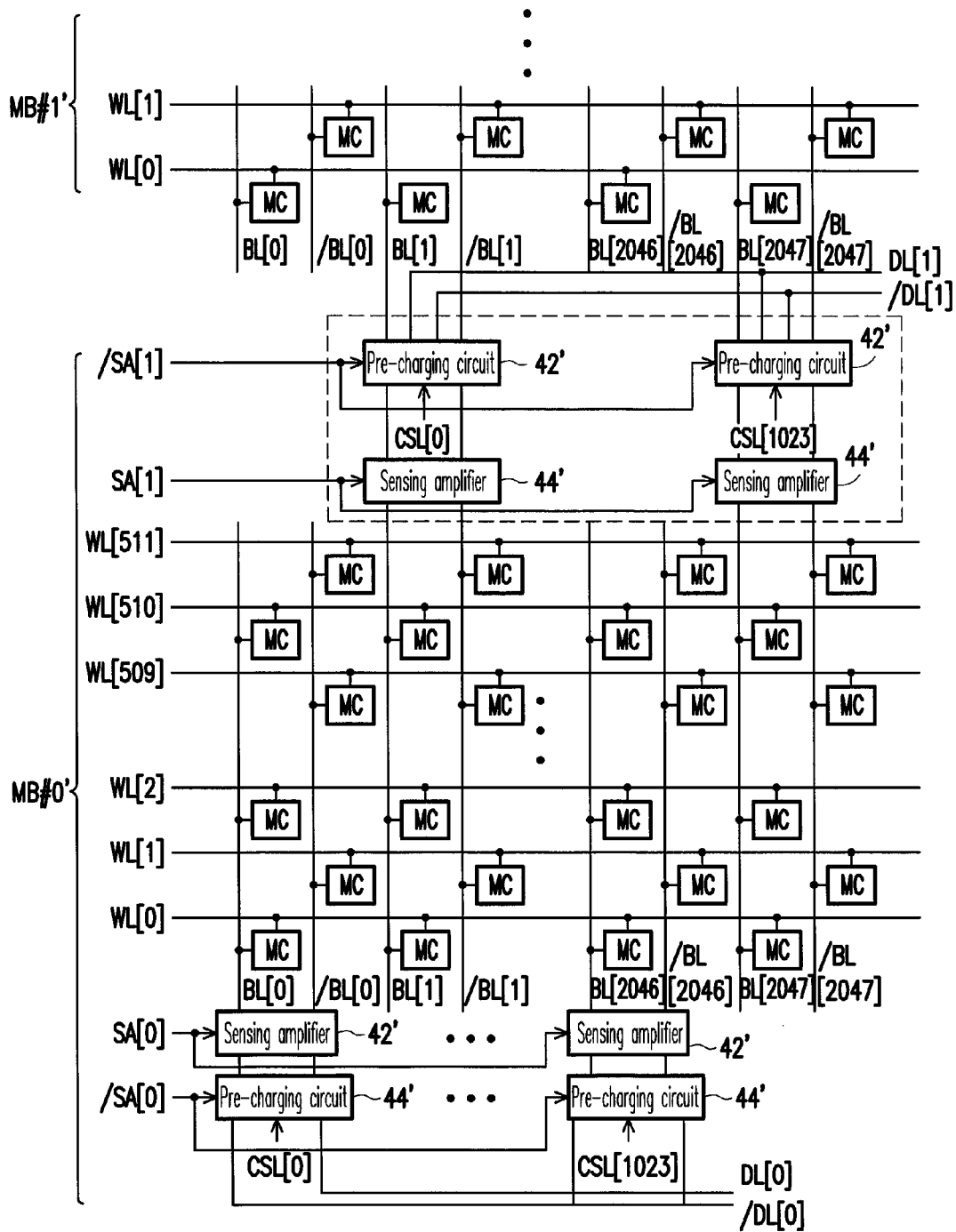
FIG. 8 is a schematic partial view illustrating the structure of memory units according to another embodiment of the invention.

According to an embodiment of the invention, each of the memory units MBi shown in FIG. 4 has 2048 pairs of bit lines, and thus 2048 sensing amplifiers and 2048 pre-charging circuits are required for latching the data of each pair of the bit lines and precharging each pair of the bit lines. To reduce the area occupied by the sensing amplifiers and the pre-charging circuits, two adjacent memory units can share the sensing amplifiers and the pre-charging circuits therebetween. FIG. 8 is a schematic partial view illustrating the structure of memory units MB#0' to MB#1' according to another embodiment of the invention. As indicated in FIG. 8, the pairs of bit lines in the memory unit MB#0' are alternately coupled to the sensing amplifiers 42' and the pre-charging circuits 44' at two sides, and the sensing amplifiers 42' and the pre-charging circuits 44' located within the area shown by dotted lines can be shared by the memory units MB#0' and MB#1'. Due to said configuration, the area occupied by the sensing amplifiers 42' and the pre-charging circuits 44' can be reduced. Besides, based on the above-mentioned memory device and the method of testing the same, the data can still be written into and read from the memory units MB#0' and MB#1' shown in FIG. 8.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions and modifications.

What is claimed is:

1. A semiconductor memory device comprising:
a plurality of memory units, each of the memory units comprising:
a memory array comprising a plurality of pairs of bit lines, a plurality of word lines, a plurality of memory cells placed at crossing positions of the bit lines and the word lines, and a plurality of sensing amplifiers, each of the sensing amplifiers being coupled to one of the pairs of bit lines, so as to latch data of the one of the pairs of bit lines according to a sensing enabling signal; and
a sensing signal generating circuit for generating the sensing enabling signal to activate the sensing amplifiers and for stopping generating the sensing enabling signal to deactivate the sensing amplifiers; and
a command decoder for generating a first row enabling signal after receiving a first activate command, so as to activate a first word line of the word lines in a first memory unit of the memory units, after receiving a set of write commands, the command decoder generating a set of column enabling signals and sequentially writing test data into the memory cells coupled to the first word line according to the set of column enabling signals, after receiving a first pre-charge command, the command decoder stopping generating the first row enabling signal, so as to deactivate the first word line, after receiving a second activate command, the command decoder generating a second row enabling signal, so as to activate a second word line of the word lines in the first memory unit of the memory units, and the command decoder stopping generating the second row enabling signal after receiving a second pre-charge command, so as to deactivate the second word line, wherein the semiconductor memory device is selectively operated in a normal mode or a test mode, when the semiconductor memory device is in the test mode, the sensing signal generating circuit generates the sensing enabling signal after the command decoder receives the first activate command, and the sensing signal generating circuit maintains a voltage value of the sensing enabling signal after the command decoder receives the first pre-charge command, such that data latched by the sensing amplifiers are directly written into the memory cells coupled to the second word line after the second word line is activated.

2. The semiconductor memory device as recited in claim 1, wherein the command decoder generates a plurality of row enabling signals after receiving the second activating command, so as to enable the word lines, and the data latched by the sensing amplifiers are directly written into the memory cells coupled to the word lines after the word lines are enabled.

3. The semiconductor memory device as recited in claim 1, each of the memory units further comprising:
   a row decoder for activating the first word line in the first memory unit according to the first row enabling signal and a first row address, activating the second word line in the first memory unit according to the second row enabling signal and a second row address, and activating a third word line of the word lines in the first memory unit according to a third row enabling signal and a third row address; and
   a column decoder for sequentially selecting one of the pairs of bit lines according to the set of column enabling signals and a set of column addresses,
   wherein the number of the word lines between the first and second word lines is the same as the number of the word lines between the second and third word lines.

4. The semiconductor memory device as recited in claim 2, each of the memory units further comprising:
   a row decoder for activating the first word line in the first memory unit according to the first row enabling signal and a first row address, activating the second word line in the first memory unit according to the second row enabling signal and a second row address, and activating a third word line of the word lines in the first memory unit according to a third row enabling signal and a third row address; and
   a column decoder for sequentially selecting one of the pairs of bit lines according to the set of column enabling signals and a set of column addresses,
   wherein the number of the word lines between the first and second word lines is the same as the number of the word lines between the second and third word lines.

5. The semiconductor memory device as recited in claim 1, each of the memory units further comprising:
   a plurality of pre-charging circuits, each of the pre-charging circuits being coupled to one of the pairs of bit lines, such that a pre-charging voltage lower than a power voltage is applied to the one of the pairs of bit lines when the pre-charging circuits are activated.

6. The semiconductor memory device as recited in claim 5, wherein the word lines in the first memory unit and in a second memory unit of the memory units are deactivated after the test data are written into the memory cells in the first and second memory units, when the memory cells are to be read, the semiconductor memory device enters the normal mode, and a sensing signal generating circuit of the first memory unit and a sensing signal generating circuit of the second memory unit stop generating the sensing enabling signals, so as to deactivate corresponding sensing amplifiers, and a plurality of pre-charging circuits of the first memory unit and a plurality of pre-charging circuits of the second memory unit are activated based on the sensing enabling signal which is no longer generated.

7. The semiconductor memory device as recited in claim 5, wherein the word lines in the first memory unit and in a second memory unit of the memory units are deactivated after the test data are written into the memory cells in the first and second memory units, the sensing signal generating circuit of the first memory unit and the sensing signal generating circuit of the second memory unit sequentially stop generating the sensing enabling signals based on a pulse signal, so as to deactivate corresponding sensing amplifiers, and a plurality of pre-charging circuits of the first memory unit and a plurality of pre-charging circuits of the second memory unit are sequentially activated based on the pulse signal.

8. A method of testing a semiconductor memory device, the semiconductor memory device comprising a plurality of memory units, each of the memory units comprising a plurality of pairs of bit lines, a plurality of word lines, a plurality of memory cells placed at crossing positions of the bit lines and the word lines, a plurality of sensing amplifiers, and a plurality of pre-charging circuits, each of the sensing amplifiers being coupled to one of the pairs of bit lines, each of the pre-charging circuits being coupled to one of the pairs of bit lines, the method comprising:
   determining whether the semiconductor memory device is operated in a normal mode or a test mode according to a mode selection signal;
   activating a first word line of the word lines in a first memory unit of the memory units according to a first activate command, a first row enabling signal, and a first row address when the semiconductor memory device is operated in the test mode;
   activating the sensing amplifiers of the first memory unit after activating the first word line;
   generating a set of column enabling signals according to a set of write commands after activating the sensing amplifiers;
   sequentially writing test data into the memory cells coupled to the first word line according to the set of column enabling signals;
   deactivating the first word line according to a first pre-charge command after writing the test data into the memory cells;
   continuously activating the sensing amplifiers and deactivating the pre-charging circuits of the first memory unit after deactivating the first word line;
   providing a second row address according to a second activate command to activate a second word line of the word lines in the first memory unit; and
   directly writing the data latched by the sensing amplifiers into the memory cells coupled to the second word line.

9. The method as recited in claim 8, wherein the first row address and the second row address are determined based on an arrangement of the word lines in the first memory unit.

10. The method as recited in claim 8, further comprising:
   providing a third row address according to the second activate command to activate a third word line of the word lines in the first memory unit; and
   directly writing the data latched by the sensing amplifiers into the memory cells coupled to the third word line.

11. The method as recited in claim 8, further comprising:
   writing the test data into all of the memory cells in the first memory unit and a second memory unit of the memory units;

deactivating the word lines in the first memory unit and the second memory unit according to a second pre-charge command;

having the semiconductor memory device enter the normal mode after deactivating the word lines;

after the semiconductor memory device enters the normal mode, deactivating a plurality of sensing amplifiers in the first memory unit, deactivating a plurality of sensing amplifiers in the second memory unit, activating a plurality of pre-charging circuits in the first memory unit, and activating a plurality of pre-charging circuits in the second memory unit; and reading the test data stored in all of the memory cells in the first and second memory units.

12. The method as recited in claim 8, further comprising:

writing the test data into all of the memory cells in the first memory unit and a second memory unit of the memory units;

deactivating the word lines in the first memory unit and the second memory unit according to a second pre-charge command;

sequentially deactivating a plurality of sensing amplifiers in the first memory unit and a plurality of sensing amplifiers in the second memory unit according to a pulse signal; and setting the semiconductor memory device to enter the normal mode to read the data stored in all of the memory cells in the first memory unit and the second memory unit, wherein when the sensing amplifiers in the first memory unit are deactivated, the pre-charging circuits in the first memory unit are activated, and when the sensing amplifiers in the second memory unit are deactivated, the pre-charging circuits in the second memory unit are activated.

* * * * *